(12) United States Patent
Kobayashi

(10) Patent No.: US 9,509,121 B2
(45) Date of Patent: Nov. 29, 2016

(54) SEMICONDUCTOR LASER ELEMENT, INTEGRATED SEMICONDUCTOR LASER ELEMENT, AND METHOD FOR PRODUCING SEMICONDUCTOR LASER ELEMENT

(71) Applicant: FURUKAWA ELECTRIC CO., LTD., Tokyo (JP)

(72) Inventor: Go Kobayashi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/829,083

(22) Filed: Aug. 18, 2015

(65) Prior Publication Data

US 2015/0357792 A1 Dec. 10, 2015

Related U.S. Application Data

(63) Continuation of application No. PCT/JP2014/053812, filed on Feb. 18, 2014.

(30) Foreign Application Priority Data

Feb. 18, 2013 (JP) .................. 2013-029291
Oct. 11, 2013 (JP) .................. 2013-214227

(51) Int. Cl.
*G02B 6/43* (2006.01)
*H01S 5/125* (2006.01)
(Continued)

(52) U.S. Cl.
CPC ............... *H01S 5/1231* (2013.01); *G02B 6/43* (2013.01); *H01S 5/0425* (2013.01);
(Continued)

(58) Field of Classification Search
CPC .... H01S 5/125; H01S 5/0425; H01S 5/4025; H01S 5/026; H01S 5/1003

USPC ........ 385/14–24; 372/5–6, 9, 43, 44, 45, 48, 372/92, 102; 250/40, 98, E33.061; 438/29
See application file for complete search history.

(56) References Cited

U.S. PATENT DOCUMENTS 5,701,325 A 12/1997 Ouchi et al.
8,472,494 B2 * 6/2013 Akiyama ............ H01S 5/02248
372/43.01
(Continued)

FOREIGN PATENT DOCUMENTS

JP 04-030490 A 2/1992
JP 05-048214 A 2/1993
(Continued)

OTHER PUBLICATIONS

International Search Report mailed May 27, 2014 for PCT/JP2014/053812 filed Feb. 18, 2014 with English Translation.
(Continued)

*Primary Examiner* — Akm Enayet Ullah
(74) *Attorney, Agent, or Firm* — Oblon, McClelland, Maier & Neustadt, L.L.P.

(57) ABSTRACT

A semiconductor laser element includes: a semiconductor-layered structure including a waveguide core layer and having a distributed feedback laser portion and a distributed Bragg reflection portion, the waveguide core layer having a length continuous in an optical cavity length direction and a diffraction grating layer being disposed in vicinity of the waveguide core layer and along the waveguide core layer in the distributed feedback laser portion, and the waveguide core layer being disposed discretely and periodically to form a diffraction grating in the distributed Bragg reflection portion; and an electrode for injecting a current to the distributed feedback laser portion. The distributed feedback laser portion oscillates a laser light at a wavelength corresponding to a period of the diffraction grating layer. The diffraction grating formed by the waveguide core layer in the distributed Bragg reflection portion is set to have a stop band including the wavelength of the laser light.

8 Claims, 9 Drawing Sheets

(51) Int. Cl.
*H01S 5/026* (2006.01)
*H01S 5/10* (2006.01)
*H01S 5/40* (2006.01)
*H01S 5/12* (2006.01)
*H01S 5/042* (2006.01)

(52) U.S. Cl.
CPC ............ *H01S 5/1003* (2013.01); *H01S 5/125* (2013.01); *H01S 5/4025* (2013.01); *H01S 5/026* (2013.01); *H01S 5/1203* (2013.01); *H01S 5/124* (2013.01); *H01S 5/4012* (2013.01); *H01S 5/4087* (2013.01)

(56) References Cited

U.S. PATENT DOCUMENTS

| | | | |
|---|---|---|---|
| 2003/0147617 A1 | 8/2003 | Park et al. | |
| 2003/0198269 A1 | 10/2003 | Wesstrom | |
| 2006/0209911 A1* | 9/2006 | Takabayashi | H01S 5/06256 372/20 |
| 2010/0265980 A1* | 10/2010 | Matsuda | B82Y 20/00 372/46.01 |
| 2010/0327257 A1 | 12/2010 | Yamamoto et al. | |
| 2011/0299561 A1* | 12/2011 | Akiyama | H01S 5/02248 372/50.11 |
| 2012/0002285 A1* | 1/2012 | Matsuda | B82Y 20/00 359/576 |
| 2012/0051386 A1 | 3/2012 | Kim et al. | |

FOREIGN PATENT DOCUMENTS

| | | |
|---|---|---|
| JP | 06-053619 A | 2/1994 |
| JP | 2005-150625 A | 6/2005 |
| JP | 2005-317695 A | 11/2005 |
| JP | 2011-198904 A | 10/2011 |
| JP | 2012/186419 A | 9/2012 |
| WO | WO 2010-116460 A1 | 10/2010 |
| WO | WO2013069483 * | 5/2013 |

OTHER PUBLICATIONS

International Written Opinion mailed May 27, 2014 for PCT/JP2014/053812 filed Feb. 18, 2014.

SeungHun Lee, et al., "High Optical Feedback-Tolerance of Distributed Reflector Lasers with Wire-like Active Regions for High Speed Isolator-Free Operation", CLEO/IQEC 2009, CTuH5.

* cited by examiner

SEMICONDUCTOR LASER ELEMENT, INTEGRATED SEMICONDUCTOR LASER ELEMENT, AND METHOD FOR PRODUCING SEMICONDUCTOR LASER ELEMENT

CROSS-REFERENCE TO RELATED APPLICATION

This application is a continuation of PCT International Application No. PCT/JP2014/053812 filed on Feb. 18, 2014 which claims the benefit of priority from Japanese Patent Application Nos. 2013-029291 filed on Feb. 18, 2013 and 2013-214227 filed on Oct. 11, 2013, the entire contents of which are incorporated herein by reference.

BACKGROUND OF THE INVENTION

1. Field of the Invention

The present invention relates to a semiconductor laser element, an integrated semiconductor laser element, and a method for producing a semiconductor laser element.

2. Description of the Related Art

Distributed reflector (DR) semiconductor laser elements are known as highly effective semiconductor lasers suitable for high-capacity transmission and long haul transmission (Japanese Laid-open Patent Publication No. H5-48214 (hereinafter to be referred to as Patent Literature) and SeungHun Lee et al., "High Optical Feedback-Tolerance of Distributed Reflector Lasers with Wire-like Active Regions for High Speed Isolator-Free Operation", CLEO/IQEC 2009, CTuH5. (hereinafter to be referred to as Non-Patent Literature)). A distributed reflector semiconductor laser element is provided with first and second diffraction grating areas formed integrally with each other along a waveguide core layer oscillating and guiding a laser light, and reflectivities differ from each other. The waveguide core layer adjacent to the first diffraction grating area is an active layer which illuminates when a current is injected thereinto and functions as a distributed feedback laser, and the second diffraction grating area functions as a passive reflector (Bragg reflector) for a laser light produced by the distributed feedback laser with no current being injected the second diffraction grating area.

Herein the distributed feedback laser element outputs laser lights from both of end faces in the same powers. By contrast, the distributed reflector semiconductor laser element described in Patent Literature outputs a laser light from only an end face at the side of the distributed feedback laser since a laser light propagating from the distributed feedback laser to the passive reflector's side is reflected by the passive reflector. As a result, a differential quantum efficiency of a single end of the distributed reflector semiconductor laser element is supposed to be approximately doubled relative to that of the distributed feedback laser element.

In a case of adapting a configuration of a distributed reflector semiconductor laser in which a waveguide core layer is deleted from a region functioning as a passive reflector, a region functioning as a distributed feedback laser must be formed in a process which is other than a process of forming a region functioning as a passive reflector. Therefore, a production error in the thickness, the composition or the like of the semiconductor layer tends to produce a difference between propagation constants of the region functioning as the distributed feedback laser and the region functioning as the passive reflector, thus causing a poor production yield.

As a means for solving the problem, Patent Literature discloses a configuration in which no waveguide core layer is deleted from the second diffraction grating area functioning as the passive reflector and in which values of coupling coefficients κ are different by differentiating depths of grating grooves of diffraction gratings between the first diffraction grating area and the second diffraction grating area. Since this configuration solves the problem of difference between propagation constants, no processes are required for removing a part of an active layer or matching propagation constants, thus a distributed reflector semiconductor laser can be achieved that is superior in productivity.

In a distributed reflector semiconductor laser element described in Non-Patent Literature, any waveguide core layers are disposed discretely at a predetermined period in both an area functioning as a distributed feedback laser and an area functioning as a passive reflector to form diffraction gratings. The distributed reflector semiconductor laser element described in Non-Patent Literature is supposed to be capable of increasing, by the above-described configuration, tolerance for noise characteristics by return light.

For example, as a wavelength-tunable light source for use in Dense Wavelength Division Multiplexing (DWDM) optical communication, an integrated semiconductor laser element is disclosed in which a plurality of distributed feedback lasers are integrated of which laser oscillation wavelengths differ from each other (Japanese Laid-open Patent Publication No. 2005-317695).

SUMMARY OF THE INVENTION

It is an object of the present invention to at least partially solve the problems in the conventional technology.

In accordance with one aspect of the present invention, a semiconductor laser element includes: a semiconductor-layered structure including a waveguide core layer and having a distributed feedback laser portion and a distributed Bragg reflection portion, the waveguide core layer having a length continuous in an optical cavity length direction and a diffraction grating layer being disposed in vicinity of the waveguide core layer and along the waveguide core layer in the distributed feedback laser portion, and the waveguide core layer being disposed discretely and periodically to form a diffraction grating in the distributed Bragg reflection portion; and an electrode for injecting a current to the distributed feedback laser portion. The distributed feedback laser portion oscillates a laser light at a wavelength corresponding to a period of the diffraction grating layer. The diffraction grating formed by the waveguide core layer in the distributed Bragg reflection portion is set to have a stop band including the wavelength of the laser light.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
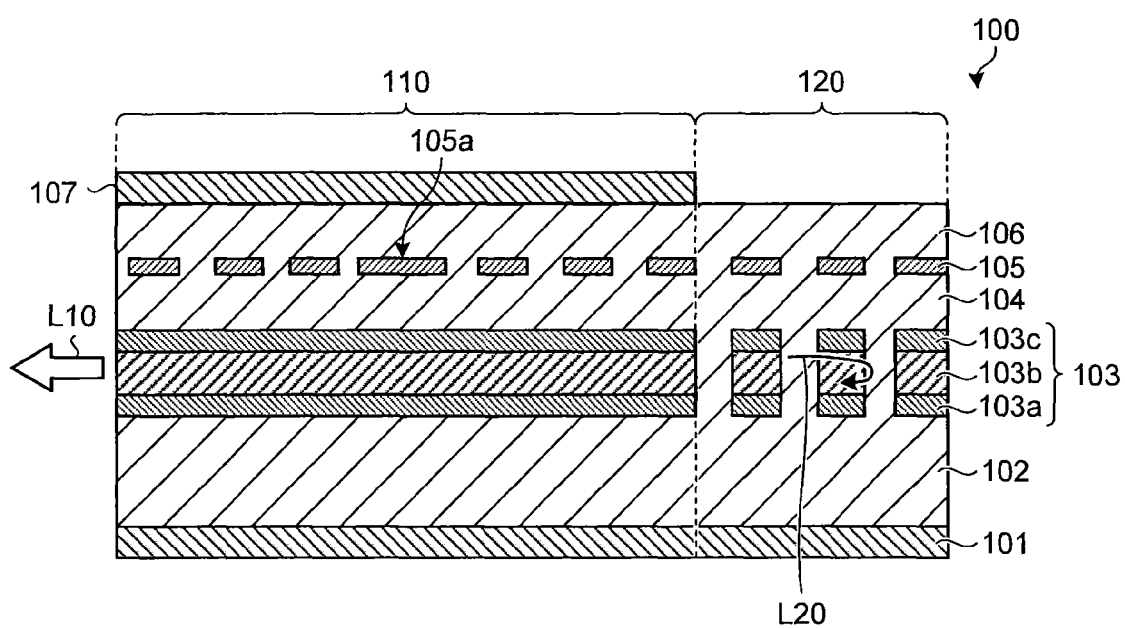
FIG. 1 is a schematic cross section of a semiconductor laser element cut along an optical cavity length direction according to an embodiment 1.

Hereinafter, embodiments of a semiconductor laser element, an integrated semiconductor laser element, and a method for producing a semiconductor laser element according to the present invention will be described in detail with reference to the drawings. However, the present invention is not limited to the embodiments. Also, in each drawing, if deemed appropriate, identical or equivalent elements are given same reference numerals. In addition, it should be noted that the drawings are schematic depictions, and do not represent the actual relation of dimension of each element. Furthermore, different drawings may include portions using different scales and dimensional relations.

In recent years, a communication scheme making use of, for example, high bit rate and multilevel modulation method (for example, 16 Quadrature Amplitude Modulation (QAM)) has been studied for achieving higher-speed and higher-capacity optical communication. It is desirable that a semiconductor laser element for use in a signal light source in such communication scheme be capable of higher output.

However, in the configuration described in Patent Literature, since a waveguide core layer adjacent to the second diffraction grating area is not deleted and no current is injected to the waveguide core layer, the waveguide core layer functions as an absorption medium for laser light. Hereby there is a problem of lowering output of a laser light.

In addition, in the configuration described in Patent Literature, since characteristics are determined by the depths of the grating grooves of the diffraction gratings, production error tends to affect the characteristics, and thus a problem is caused that characteristics of obtained products vary to a large degree. Therefore, the problem of poor production yield remains unsolved.

In contrast, the embodiment described below obtains a semiconductor laser element which is high in optical output and superior in production yield.

FIG. 1 is a schematic cross sectional view of the semiconductor laser element cut along an optical cavity length direction according to the embodiment 1 of the present invention. As shown in FIG. 1, a semiconductor laser element 100 includes an n-type semiconductor layer 102 having an n-side electrode 101 on a back surface thereof, waveguide core layers 103 formed on the n-type semiconductor layer 102, a p-type semiconductor layer 104 formed on the waveguide core layers 103, diffraction grating layers 105 formed on the p-type semiconductor layer 104, a p-type semiconductor layer 106 formed on the diffraction grating layers 105, and a p-side electrode 107 formed on the p-type semiconductor layer 106.

The n-type semiconductor layer 102, the waveguide core layers 103, the p-type semiconductor layer 104, the diffraction grating layer 105, and the p-type semiconductor layer 106 constitute a semiconductor-layered structure. The semiconductor-layered structure includes a distributed feedback laser portion 110 and a distributed Bragg reflection portion 120 adjacent to the distributed feedback laser portion 110. Formed on an end face of the semiconductor-layered structure at the side of the distributed feedback laser portion 110 (an end face on a left-hand side of the drawing) is an anti-reflection layer which is not shown in the drawings.

Elements constituting the semiconductor-layered structure will be explained. The n-type semiconductor layer 102 has a configuration in which a cladding layer made of n-type InP is formed on a substrate made of n-type InP.

The waveguide core layer 103 has an MQW-SCH structure including a multi-quantum-well(MQW)-structured layer 103b made of GaInAsP and formed by a plurality of barrier layers and a plurality of well layers, and separate confinement hetero-structure (SCH) layers 103a and 103c disposed to sandwich the MQW layer 103b. The thickness of the MQW layer 103b is, for example, 40 nm to 60 nm, and the thicknesses of the SCH layers 103a, 103c are, for example, 30 nm. The waveguide core layer 103 may be made of AlGaInAs.

Herein in the distributed feedback laser portion 110, the waveguide core layer 103 is of a length continuing in the optical cavity length direction. On the other hand, in the distributed Bragg reflection portion 120, the waveguide core layers 103 are disposed discretely and periodically to form a diffraction grating. Spaces among the waveguide core layers 103 are buried by the same semiconductor material as that of the p-type semiconductor layer 104.

The p-type semiconductor layer 104 is constituted by a cladding layer made of p-type InP. The thickness of the p-type semiconductor layer 104 is, for example, 100 nm to 200 nm.

The diffraction grating layers 105 are configured in which GaInAsP layers are disposed discretely at a predetermined period to form a diffraction grating, and in which spaces among the GaInAsP layers are buried by an InP layer. The diffraction grating layers 105 are disposed in the vicinity of the waveguide core layers 103 and along the waveguide core layers 103. A λ/4 phase-shifting portion 105a is formed at a predetermined position in the optical cavity length direction of the diffraction grating layers 105.

The p-type semiconductor layer 106 is configured in which a contact layer made of p-type GaInAsP is formed on a spacer layer made of p-type InP.

The p-side electrode 107 is formed on the p-type semiconductor layer 106 in the distributed feedback laser portion 110. The contact layer of the p-type semiconductor layer 106 has a function of decreasing electric resistance to the p-side electrode 107.

Hereafter, an operation of the semiconductor laser element 100 will be explained. To start with, a voltage is applied between the n-side electrode 101 and the p-side electrode 107 to inject a driving current. Since the p-side electrode 107 is formed on the p-type semiconductor layer 106 in the distributed feedback laser portion 110, the driving current is injected to the waveguide core layer 103 in the distributed feedback laser portion 110. Then, the waveguide core layer 103 into which the driving current is injected in the distributed feedback laser portion 110 functions as an active layer.

Since, herein the distributed feedback laser portion 110 has the diffraction grating layers 105 disposed in the vicinity of the waveguide core layers 103 and along the waveguide core layers 103, the distributed feedback laser portion 110 functions as a distributed feedback laser. Therefore, when the driving current is injected, laser oscillation occurs at a wavelength corresponding to the period of the diffraction grating layers 105.

On the other hand, since the waveguide core layers 103 are disposed discretely and periodically to form a diffraction grating in the distributed Bragg reflection portion 120, the distributed Bragg reflection portion 120 functions as a distributed Bragg reflector (DBR) portion. Therefore, the distributed Bragg reflection portion 120 conducts Bragg reflection to a laser light L20 oscillated in the distributed feedback laser portion 110.

Therefore, the semiconductor laser element 100 functions as a distributed reflector semiconductor laser element and outputs a laser light L10 from only the end face at the side of the distributed feedback laser portion 110 (an end face on a left-hand side of the drawing).

In the semiconductor laser element 100, since the waveguide core layers 103 themselves constitute a DBR in the distributed Bragg reflection portion 120, a coupling coefficient κ of the diffraction grating formed by the waveguide core layers 103 can be made large.

Since the waveguide core layers 103 are disposed discretely in the distributed Bragg reflection portion 120, the distributed Bragg reflection portion 120 bears fewer optical absorption than in a case where the waveguide core layer 103 is in a continuous length. As a result, the laser light L10 being output is restrained from being reduced in its optical power.

Since the thickness of a region of the diffraction grating of the semiconductor laser element described in Patent Literature has to be increased to obtain a deeper grating groove, sometimes crystallinity decreased and optical absorption increased. Hereby there are problems that an outputted laser light and the reliabilities of a laser element decreased and production yield reduced. On the other hand, the present embodiment 1 is capable of obtaining a difference between the coupling coefficients κ of the distributed feedback laser portion 110 and the distributed Bragg reflection portion 120 even though the diffraction grating layer 105 is not increased in thickness. Therefore, the output of the laser light and the reliabilities of the laser element are restrained from being decreased by increasing the thickness of the diffraction grating layer, and further capable of restraining the production yield from being reduced. For example, the thickness of the diffraction grating layer 105 is 5 nm to 50 nm, and 20 nm to 50 nm is more preferable.

Moreover, since the waveguide core layer 103 has a continuous length in the optical cavity length direction in the distributed feedback laser portion 110, gain increases and the power of the laser light L10 being outputted increases. Since no processing is conducted to the waveguide core layer 103 in the distributed feedback laser portion 110 to which an electric power is injected, reliability and production yield are restrained from being reduced. If the waveguide core layer 103 in the region where the electric power is injected is processed, possibly a dislocation propagates from a processed interface to inside thereof, the region into which the electric power is injected tends to deteriorate easily over time.

As described above, since the semiconductor laser element 100 according to the present embodiment 1 is, high in optical output and reliability, superior in production yield, and easy to achieve a narrower spectral linewidth, it is preferable as a signal light source for a communication scheme making use of, for example, a high bit rate multi-level modulation method.

(Production Method)

An example of a method for producing the semiconductor laser element according to the present embodiment 1 will be explained. FIGS. 2A to 2D and FIGS. 3A to 2D are views for explaining a method for producing the semiconductor laser element according to the embodiment 1. FIGS. 2A to 2D and FIGS. 3A to 2D show cross sections corresponding to the cross section shown in FIG. 1.

Figure 2A:
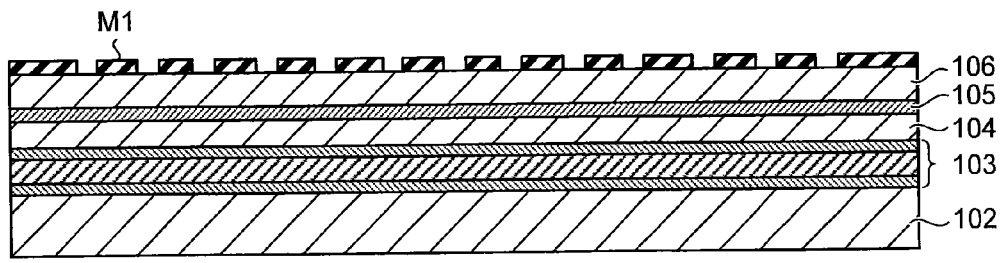
FIG. 2A to 2D are a view for explaining a method of producing the semiconductor laser element according to the embodiment 1.

At first, a process of forming the semiconductor-layered structure having a region which becomes the distributed feedback laser portion 110 including the waveguide core layer 103 and the diffraction grating layers 105 disposed along the waveguide core layer 103 and a region which becomes the distributed Bragg reflection portion 120 including the waveguide core layers 103 will be explained. As shown in FIG. 2A, by using a crystal-growing apparatus such as a metal organic chemical vapor deposition (MOCVD) crystal-growing apparatus or the like, a cladding layer made of n-type InP is formed on a substrate made of n-type InP to form the n-type semiconductor layer 102, and moreover, the waveguide core layers 103, the p-type semiconductor layer 104, the diffraction grating layer 105, and the p-type semiconductor layer 106 are formed on the n-type semiconductor layer 102 in this order. However, the diffraction grating layer 105 in this state is made of a GaInAsP layer having no diffraction grating structure.

Hereafter a first-etching step will be explained in which the diffraction grating layers 105 in the region which becomes the distributed feedback laser portion 110 of the semiconductor-layered structure are etched to be disposed discretely at a predetermined period. At first, as shown in FIG. 2A, a mask M1 made of SiN is formed on the p-type semiconductor layer 106 by, for example, chemical vapor deposition (CVD) method to conduct patterning into a predetermined mask pattern.

Figure 2B:
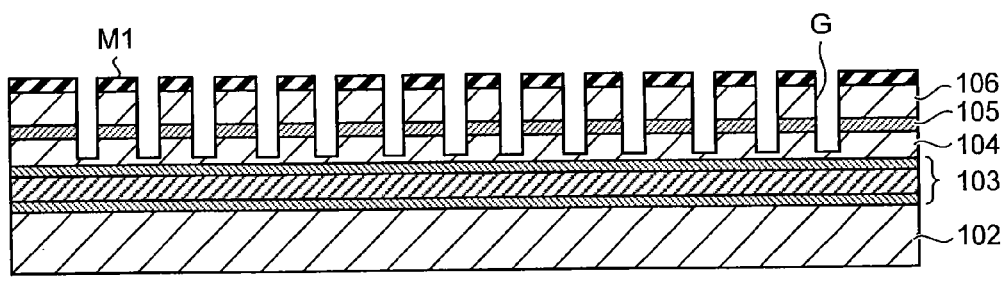

Secondly, as shown in FIG. 2B, the semiconductor-layered structure is etched, by using, for example, inductive coupling plasma (ICP)-reactive ion etcher (RIE) and by using a mask M1 as a mask to form a groove G being deeper than the p-type semiconductor layer 106 and the diffraction grating layer 105 and reaching the p-type semiconductor layer 104 in depth. Hereby the diffraction grating structure of the diffraction grating layer 105 is formed.

Figure 2C:
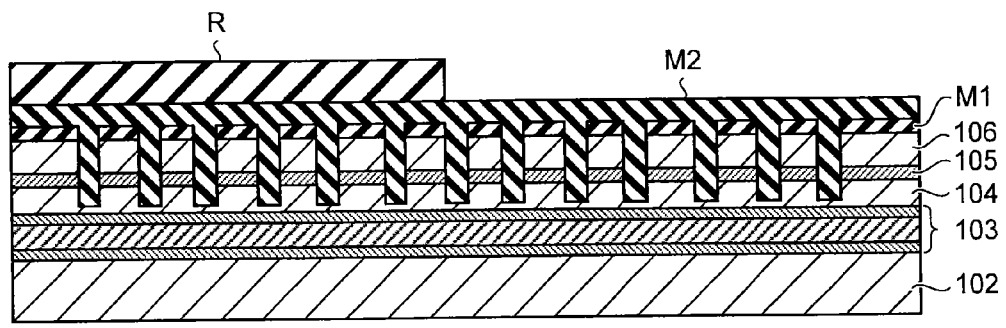

Hereafter, a second etching step of etching the waveguide core layer 103 of the region becoming the distributed Bragg reflection portion 120 in the semiconductor-layered structure so that the waveguide core layers 103 are disposed discretely at a predetermined period. At first, as shown in FIG. 2C, a mask M2 is formed so as to bury the groove G and cover the mask M1, and then, a resist layer R is formed on the mask M2 of a region which becomes the distributed feedback laser portion 110. Herein the mask M2 is made of a material of which etching rate for a predetermined etching solution is different from that of the mask M1. A material of the mask M2 is, for example, $SiO_2$, and a spin-on-glass (SOG) is usable. If the mask M2 is made of $SiO_2$, the mask M1 may be a layer made of silicon or metal.

Figure 2D:
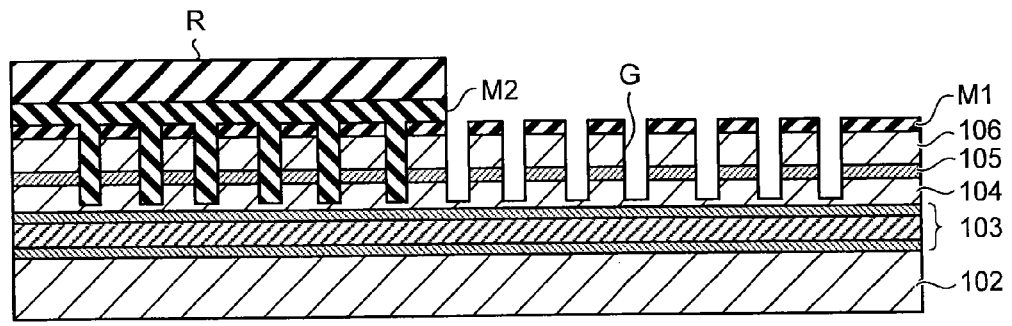

Then, as shown in FIG. 2D, the mask M2 of the region becoming the distributed Bragg reflection portion 120 is removed by using buffered HF (BHF) by using a resist layer R as an etching mask to make the groove G be exposed. In this state, since an etching rate for the mask M2 by BHF is greater than an etching rate for the mask M1 by BHF, the mask M2 is etched selectively, and thus the mask M1 remains.

Figure 3A:
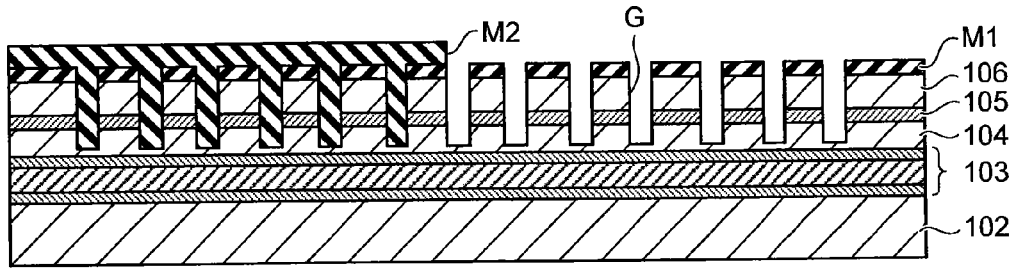
FIG. 3A to 3D are a view for explaining the method of producing the semiconductor laser element according to the embodiment 1.
Figure 3B:
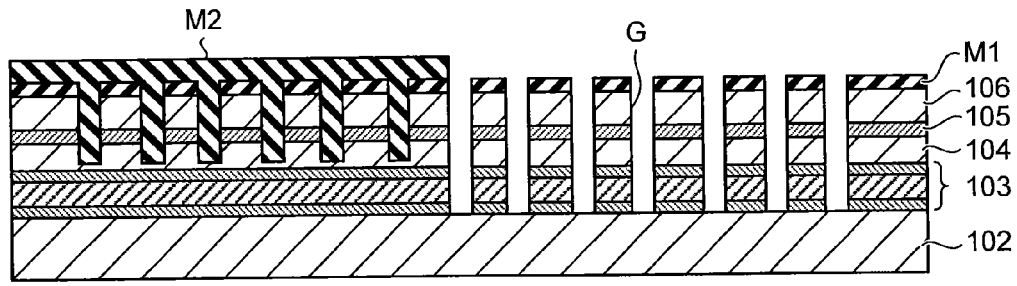

Then, as shown in FIG. 3A, the resist layer R is removed. Moreover, as shown in FIG. 3B, the groove G is further etched by ICP-RIE to a depth reaching a bottom surface of the waveguide core layer 103. As a result, the waveguide core layer 103 is separated by the groove G in the region becoming the distributed Bragg reflection portion 120, thus a diffraction grating structure is formed in which the waveguide core layers 103 are disposed periodically. On the other hand, in the region becoming the distributed feedback laser portion 110, the waveguide core layer 103 has a length continuing in the optical cavity length direction. That is, the second etching step is a process of forming the mask M2 on the topmost surface of the region becoming the distributed feedback laser portion 110 and protecting the waveguide core layer 103 of the region becoming the distributed feedback laser portion 110 from being etched in the second etching step.

The diffraction grating layer 105 does not have to exist in the distributed Bragg reflection portion 120, but does not have to be removed in the production process since the diffraction grating layer 105 also contributes to coupling coefficient κ in the distributed Bragg reflection portion 120.

Figure 3C:
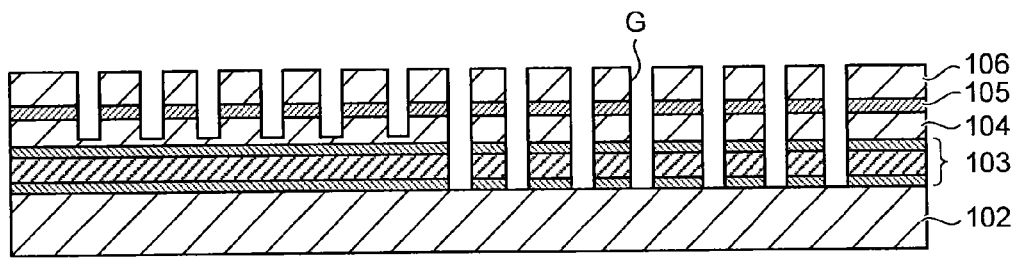
Figure 3D:
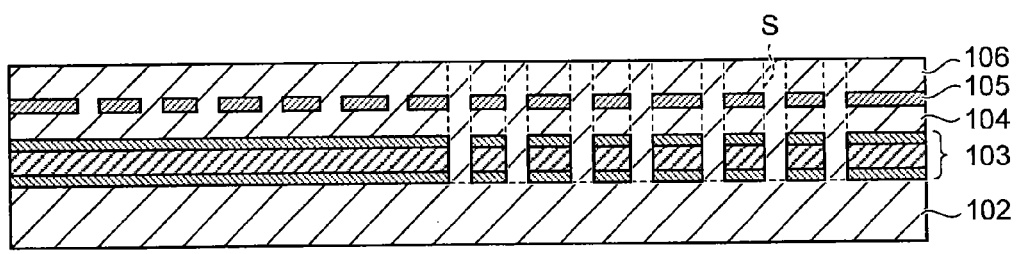

After that, as shown in FIG. 3C, the masks M1, M2 are removed, and then, as shown in FIG. 3D, the groove G is buried by the crystal-growing apparatus with a semiconductor material S that is the same semiconductor material as that of the p-type semiconductor layer 104. After that, the p-side electrode 107 made of, for example, AuZn and the n-side electrode 101 having an AuGeNi/Au structure are formed, and necessary processing of formation of anti-reflection layers, separation of elements or the like are conducted, then the structure of the semiconductor laser element 100 according to the present embodiment 1 is completed.

In the above-described production method, a production process has been explained in which the semiconductor-layered structure is first etched until reaching the diffraction grating layer 105 of which etching depth is shallower, and then, the semiconductor-layered structure is etched until reaching the deeper waveguide core layer 103, this does not limit the method for producing the semiconductor laser element 100 of the present invention. For example, the semiconductor-layered structure may be etched first until reaching the waveguide core layer 103 of which etching depth is deeper. The distributed feedback laser portion 110 and the distributed Bragg reflection portion 120 may be etched in separate steps. The steps for producing the semiconductor laser element 100 according to the present invention may include a step of etching the diffraction grating layers 105 in a region which becomes the distributed feedback laser portion 110 of the semiconductor-layered structure, to be disposed discretely at a predetermined period, and a step of etching the waveguide core layers 103 in a region which becomes the waveguide core layer 103 of the semiconductor-layered structure, to be disposed discretely at a predetermined period.

In the semiconductor laser element 100 according to the present embodiment 1, the waveguide core layers 103 in the region which becomes the distributed Bragg reflection portion 120 are fully etched periodically. Herein, in a case where the depth of etching is halfway through the waveguide core layer 103, the coupling coefficient depending on the depth varies. By contrast, if fully etched even if further etched deeper later, the coupling coefficient does not vary. Therefore, even in a case where the depth of etching varies, the coupling coefficient does not change, and thus, it is possible to reduce variations of characteristics among production lots. As a result, it is possible to restrain the production yield from decreasing.

(Design Parameter)

Figure 4:
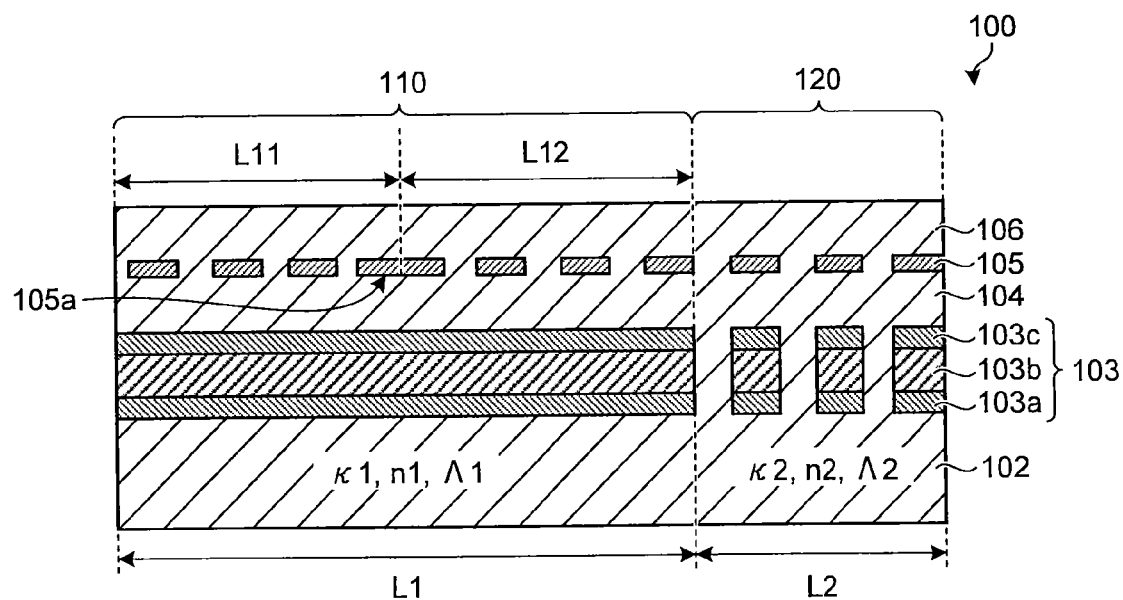
FIG. 4 is a view for explaining design parameters for the semiconductor laser element according to the embodiment 1.

Hereafter, design parameters that are preferable for the semiconductor laser element 100 according to the present embodiment 1 will be explained. FIG. 4 is a view explaining design parameters of the semiconductor laser element 100 according to the present embodiment 1.

As shown in FIG. 4, design parameters for the distributed feedback laser portion 110 of the semiconductor laser element 100 are, an optical cavity length L1 of the distributed feedback laser portion 110, lengths L11, L12 sandwiching the λ/4 phase-shifting portion 105a of the diffraction grating layer 105, a coupling coefficient κ1 and period Λ1 of the diffraction grating layer 105, and an effective refractive index n1 of the waveguide core layer 103.

Design parameters for the distributed Bragg reflection portion 120 are, a length L2 in the optical cavity length direction of the distributed Bragg reflection portion 120, the coupling coefficient κ2 and period Λ2 of a diffraction grating formed by the waveguide core layer 103, and an effective refractive index n2 of the waveguide core layer 103.

At first, a design parameter is n1×Λ1=n2×Λ2 in order to match a laser oscillation wavelength at the distributed feedback laser portion 110 with a reflection center wavelength at the distributed Bragg reflection portion 120. The laser oscillation wavelength at the distributed feedback laser portion 110 is 2n1×Λ1 and the reflection center wavelength at the distributed Bragg reflection portion 120 is 2n2×Λ2.

If a spectral linewidth of the laser light L10 to be output is narrow, it is more preferable for a signal light source for a high bit rate communication scheme. In order to narrow the spectral linewidth of the laser light L10, it is preferable to increase the optical cavity length L1 and to increase the coupling coefficient κ1. However, if the coupling coefficient κ1 is too increased, a multi-mode oscillation may occur due to a phenomenon of hole-burning. From a view point of higher output, it is preferable to increase the optical cavity length L1 and decrease the coupling coefficient κ1. A value preferable for the coupling coefficient κ1 is, for example, 7 $cm^{-1}$ to 20 $cm^{-1}$. A value preferable for the optical cavity length L1 is equal to or greater than 820 μm, and more preferably equal to or longer than 1000 μm.

Figure 5:
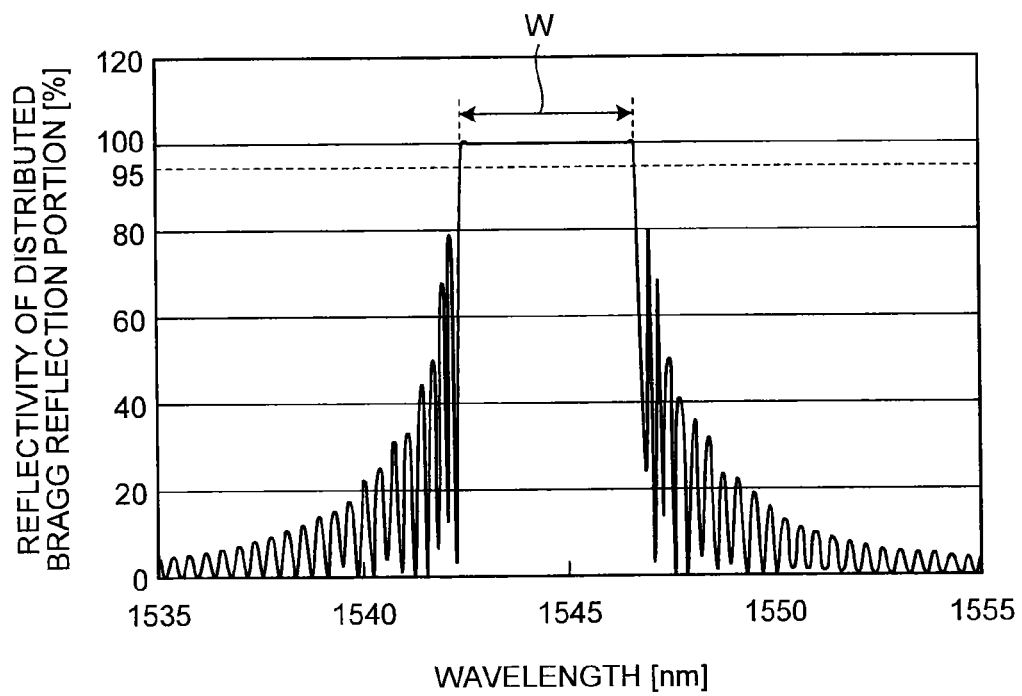
FIG. 5 is a view showing an example of reflectivity of a distributed Bragg reflection portion relative to wavelength.

On the other hand, it is preferable that the coupling coefficient κ2 be greater since a reflection wavelength bandwidth (stop band width) becomes wider at the distributed Bragg reflection portion 120. FIG. 5 is a view showing one example of a reflectivity at the distributed Bragg reflection portion relative to a wavelength. In FIG. 5, a horizontal axis indicates wavelength and a vertical axis indicates reflectivity at the distributed Bragg reflection portion 120. Hereafter, the stop band width indicates a wavelength bandwidth (width W in FIG. 5) at which reflectivity relative to the maximum reflectivity is equal to or greater than 95%. A value preferable for the coupling coefficient κ2 is, for example, equal to or greater than 180 $cm^{-1}$, and more preferably equal to or longer than 200 $cm^{-1}$ Herein the coupling coefficient κ2 can be increased by, increasing the thickness of the waveguide core layer 103 or making a ratio in length (duty ratio) of the waveguide core layer 103 and the p-type semiconductor material burying between the waveguide core layers 103 closer to 50%. In the present embodiment 1, the duty ratio of the distributed Bragg reflection portion 120 is all 50%.

The coupling coefficient κ1 can be increased by, increasing the thickness of the diffraction grating layer 105, decreasing the distance between the diffraction grating layer 105 and the waveguide core layer 103, increasing the refractive index at the diffraction grating layer 105, or making the ratio in length (duty ratio) between the diffraction grating layer 105 and the p-type semiconductor material burying between the diffraction grating layers 105 close to 50%.

In addition, it is preferable to make the laser oscillation wavelength at the distributed feedback laser portion 110 be inside the stop band of the distributed Bragg reflection portion 120 since the laser light L20 (see FIG. 1) is reflected securely by the distributed Bragg reflection portion 120. As described above, the laser oscillation wavelength is inside the stop band of the distributed Bragg reflection portion 120 by matching the laser oscillation wavelength at the distributed feedback laser portion 110 with the reflection center wavelength at the distributed Bragg reflection portion 120 by setting parameters as n1×Λ1=n2×Λ2.

However, since the temperature of the distributed feedback laser portion 110 increases when a current is injected thereinto, a difference of temperatures occurs between the distributed feedback laser portion 110 and the distributed Bragg reflection portion 120. When the difference of temperatures occurs, the condition of n1×Λ1=n2×Λ2 does not hold effective because mainly of a dependency of refractive index on temperature, and thus, a displacement occurs between the laser oscillation wavelength and the reflection center wavelength.

To address this, a semiconductor laser element was manufactured, according to an example, which has a configuration similar to that of FIG. 1 and in which a laser oscillation wavelength was set at 1548.6 nm, to study a relationship between a driving current and a displacement amount between the laser oscillation wavelength and the reflection center wavelength. Parameters were set as κ1=10 cm$^{-1}$, κ2=180 cm$^{-1}$, L1=1500 μm, L11=900 μm, L12=600 μm, L2=900 μm, Λ1=242.537 nm, Λ2=243.557 nm, n1=3.193, and n2=3.181.

Although a higher output is obtained if the length L11 is shorter relative the length L1, a stable single-mode oscillation cannot be obtained if the length L11 is too short. Therefore, it is preferable that L11/L1 be 60% to 100%, and L11/L1 is set to be 60% in the present embodiment 1.

Figure 6:
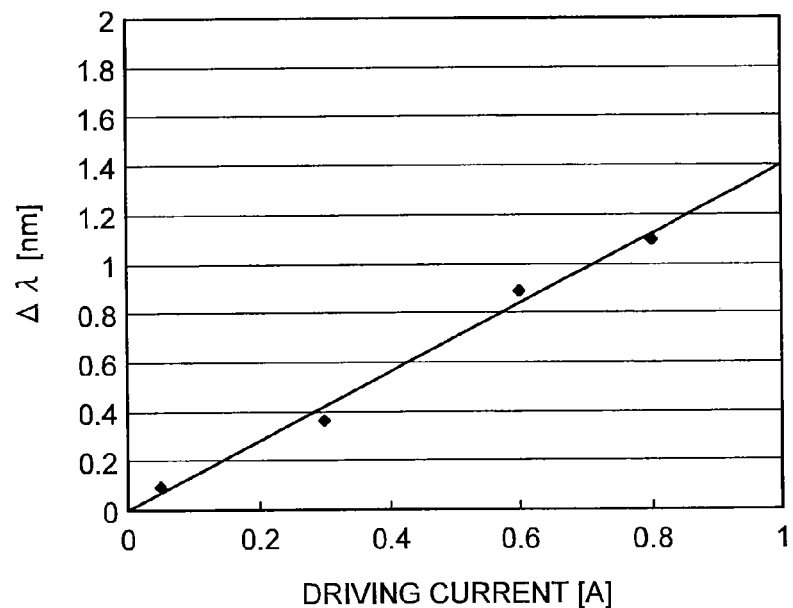
FIG. 6 is a view showing a relationship between a driving current and a displacement amount between a laser oscillation wavelength and a reflection center wavelength.

FIG. 6 is a view showing a relationship between a driving current and a displacement amount between the laser oscillation wavelength and the reflection center wavelength. In FIG. 6, a horizontal axis indicates driving current and a vertical axis indicates displacement amount Δλ. A solid line is a fitting line of data points. As shown in FIG. 6, when a driving current was 500 mA, a displacement amount Δλ was 0.7 nm, and when a driving current was 1 A, a displacement amount Δλ was 1.4 nm. Therefore, it is preferable that a stop band width of the distributed Bragg reflection portion 120 be set so that, even if such a displacement occurs within a range of driving current, the laser oscillation wavelength is included inside the stop band of the distributed Bragg reflection portion 120. Hereby, even if a reflection center wavelength displacement occurs, a laser oscillation spectrum is stable and a laser light power is stable. In addition, a stable single-mode oscillation can be obtained.

In the case of this example, it is preferable that the stop band width be equal to or larger than 0.7 nm or equal to or larger than 1.4 nm, the actual stop band width was 4.4 nm which satisfied the conditions of equal to or larger than 0.7 nm and, in addition, equal to or larger than 1.4 nm. In addition, it is preferable that a relationship between n1×Λ1 and n2×Λ2 be set so that the laser oscillation wavelength is positioned at the shorter wavelength side of the stop band when the driving current is minimum and the laser oscillation wavelength is positioned at the longer wavelength side of the stop band when the driving current is maximum. For example, it is preferable that n1×Λ1<n2×Λ2 hold effective at a temperature at which the semiconductor laser element is driven.

Figure 7:
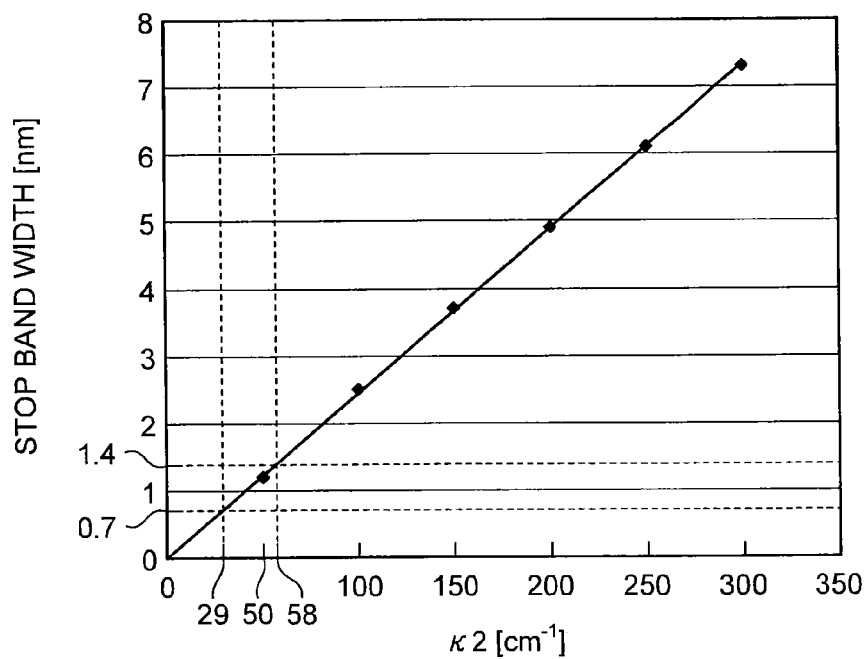
FIG. 7 is a view showing a relationship between a coupling coefficient κ2 and a stop band width.

Next, FIG. 7 is a view showing a relationship between coupling coefficient κ2 and the stop band width. A solid line is a fitting line of data points. As shown in FIG. 7, κ2 may be equal to or greater than 29 cm$^{-1}$ to make the stop band width equal to or larger than 0.7 nm, and may be equal to or greater than 58 cm$^{-1}$ to make the stop band width equal to or larger than 1.4 nm.

Figure 8:
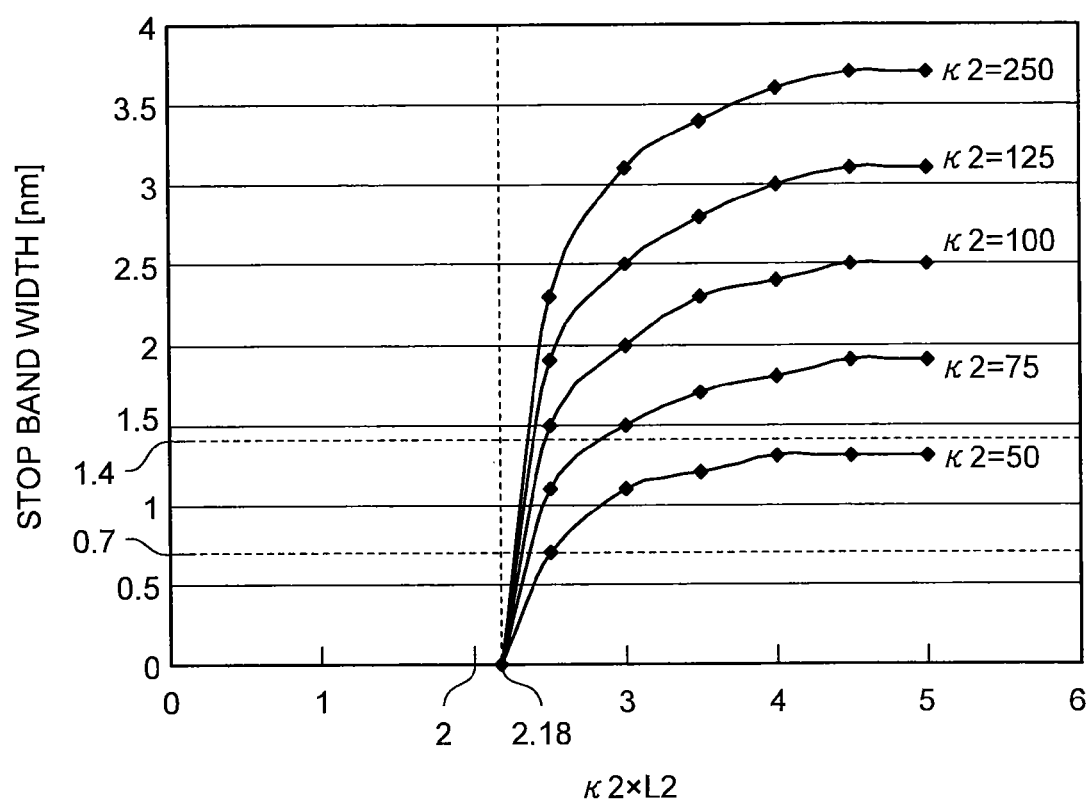
FIG. 8 is a view showing a relationship between κ2×L2 where a waveguide loss of the distributed Bragg reflection portion is zero and an area width where a reflectivity of the distributed Bragg reflection portion is equal to or greater than 95%.

FIG. 8 is a view showing a relationship between κ2×L2 and an area width of which reflectivity is equal to or greater than 95% in a case where a waveguide loss at the distributed Bragg reflection portion is zero. Meanwhile, κ2 is shown for cases of 50 cm$^{-1}$, 75 cm$^{-1}$, 100 cm$^{-1}$, 125 cm$^{-1}$, and 250 cm$^{-1}$. It is necessary that the reflectivity at the distributed Bragg reflection portion 120 be as high as possible since, if the reflectivity at the distributed Bragg reflection portion 120 is low, a rate for improving the spectral linewidth decreases. As shown in FIG. 8, the area width is larger than 0 nm when κ2×L2 is larger than 2.18. Also, the area width is larger as the coupling coefficient κ2 is larger.

Figure 9:
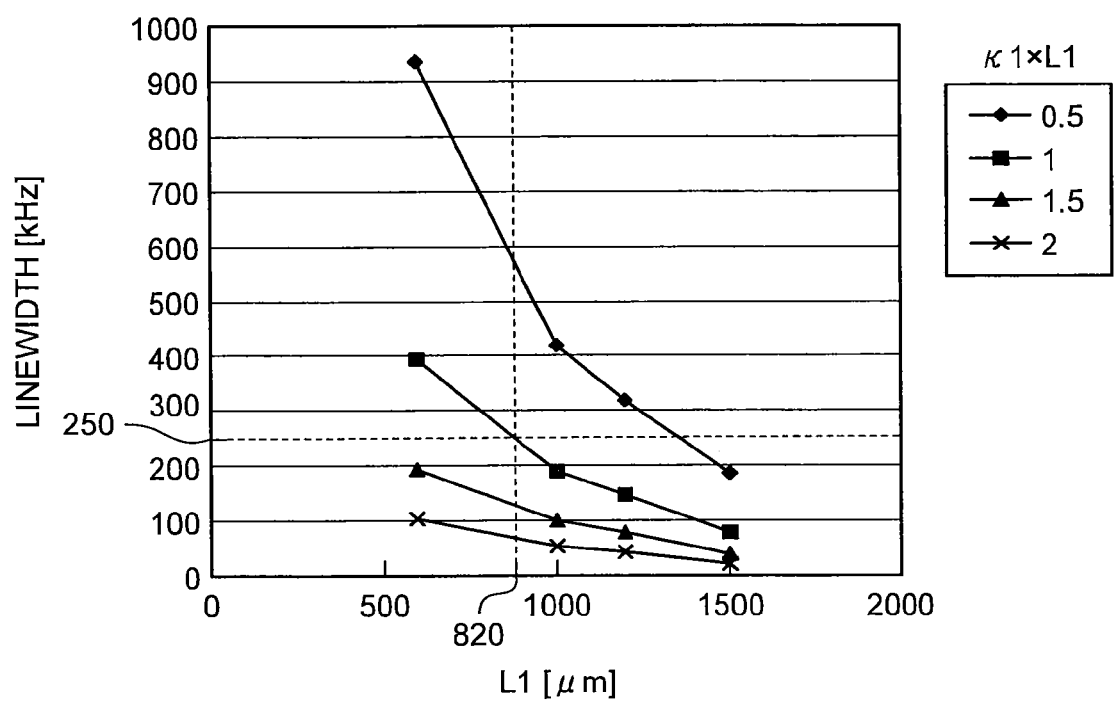
FIG. 9 is a view showing a relationship between a length L1 and a spectral linewidth.

FIG. 9 is a view showing a relationship between the length L1 and the spectral linewidth. Meanwhile, κ1×L1 is shown for cases of 0.5, 1, 1.5, and 2. As shown in FIG. 9, as the length L1 is greater and as κ1×L1 is greater, the spectral linewidth is narrower. For example, for making the spectral linewidth equal to or less than 250 kHz, it is preferable that κ1×L1 be equal to or greater than 1 and L1 be equal to or greater than 820 μm.

It is preferable that a spectral linewidth of a signal light source be equal to or less than 500 kHz in a case where a modulation bit rate is 100 GHz, and a spectral linewidth be equal to or less than 300 kHz, and more preferably be equal to or less than 100 kHz in a case where a modulation bit rate is 200 GHz. Therefore, it is preferable that κ1×L1 and L1 be set in accordance with desirable spectral linewidth and optical output.

In addition, as described above, in order to achieve a narrower spectral linewidth and a broader stop band width, κ1×L1<κ2×L2 is preferable.

Herein a semiconductor laser element according to the example was produced to measure a spectrum of a laser light in a case where driving currents are 50 mA and 500 mA.

As a result, when the driving current was 50 mA, a stop band width was 4.4 nm which is from 1542.0 nm to 1546.4 nm, and a oscillation peak was 1542.6 nm. When the driving current was 500 mA, a stop band width was 4.4 nm which is from 1547.6 nm to 1552.0 nm, and an oscillation peak was 1548.6 nm. It was confirmed that, in a case where the driving current was either one of 50 mA and 500 mA, the laser oscillation wavelength was inside the stop band, and thus the semiconductor laser element according to the example obtained a desirable optical output.

For the semiconductor laser element according to the above-described embodiment 1, material of the composite semiconductors and the electrodes, size, design parameter and the like or the like are set so that the laser light is of 1550 nm wavelength band. However, each material, size and the like can be set appropriately so as to oscillate a desirable wavelength of laser light within, for example, an optical communication wavelength bandwidth, and is not limited specifically.

Figure 10:
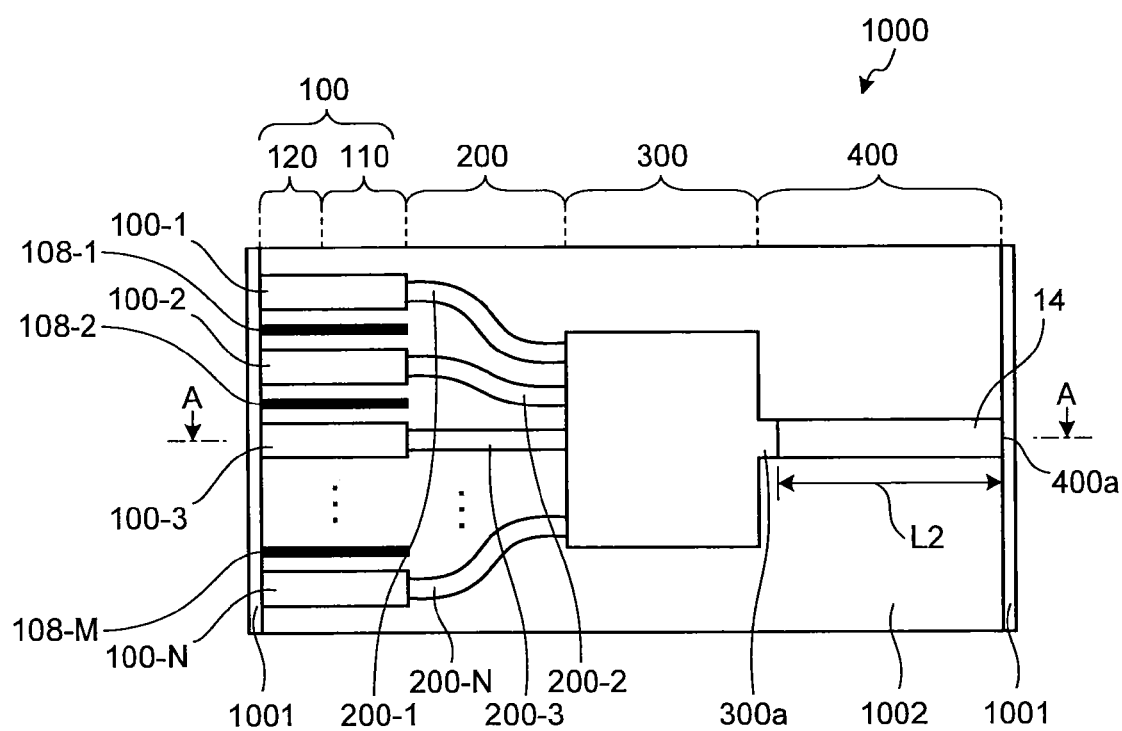
FIG. 10 is a schematic plan view of an integrated semiconductor laser element according to an embodiment 2.

Hereafter, an integrated semiconductor laser element according to an embodiment 2 using the semiconductor laser element according to the embodiment 1 will be explained. FIG. 10 is a schematic plan view of an integrated semiconductor laser element according to the embodiment 2. As shown in FIG. 10, the integrated semiconductor laser element 1000 according to the present embodiment 2 has a structure in which, N pieces of semiconductor laser elements 100-1 to 100-N each having a mesa structure (N is an integer equal to or greater than 1), N pieces of optical waveguides 200-1 to 200-N into which an output light from the semiconductor laser elements 100-1 to 100-N are input respectively, an optical coupler 300 having N pieces of input ports and being capable of coupling, and outputting, output lights from the optical waveguides 200-1 to 200-N, and a semiconductor optical amplifier (SOA) 400 amplifying the output light from the optical coupler 300 are integrated on a semiconductor substrate and buried with a buried portion 1002. In a buried portion 1002 among the semiconductor laser elements 100-1 to 100-N, trench grooves 108-1 to 108-M (M=N−1) are provided. In addition, on both end faces of the integrated semiconductor laser element 1000, anti-reflection layers 1001 are provided for preventing a noise due to return light.

The configuration of the N pieces of the semiconductor laser elements 100-1 to 100-N is the same as that of the semiconductor laser element 100 of the embodiment 1 respectively, and each of the semiconductor laser elements 100-1 to 100-N is an edge-emitting laser having a striped buried structure having a width of 1.5 μm to 3 μm. The semiconductor laser elements 100-1 to 100-N are formed at an end of the integrated semiconductor laser element 1000 at a pitch of 25 μm in a width direction, for example. The semiconductor laser elements 100-1 to 100-N are configured so that, by setting design parameters for each semiconductor laser element appropriately, output lights become single mode oscillations of laser lights and their laser oscillation wavelengths differ from each other within a range of approximately 1530 nm to 1570 nm, for example. Each of oscillation wavelengths of the semiconductor laser elements 100-1 to 100-N can be fine-tuned by changing a temperature set for the integrated semiconductor laser element 100. That is, the integrated semiconductor laser element 1000 achieves a wide wavelength-tunable range by switching, and controlling a temperature for, the semiconductor laser element to be driven.

It is preferable that a range for fine-tuning a laser oscillation wavelength of each of the semiconductor laser elements 100-1 to 100-N by the temperature control be equal to or less than approximately 3 nm. Therefore, in order to cover the range of approximately 1530 nm to 1570 nm of the wavelengths, it is preferable that the number of the semiconductor laser elements 100-1 to 100-N be equal to or greater than twelve, for example, sixteen. However, N is not limited to a specific value. In addition, the range of the oscillation wavelength of the semiconductor laser elements 100-1 to 100-N may be, for example, approximately 1570 nm to 1610 nm.

Figure 11:
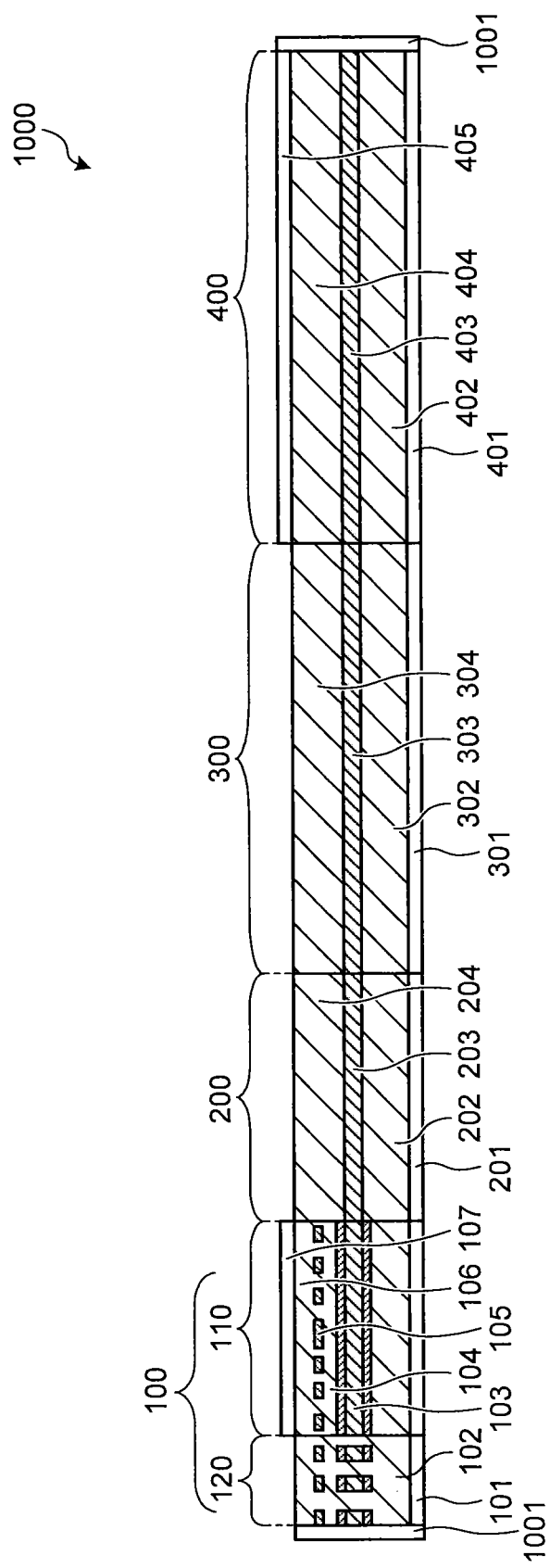
FIG. 11 is a view showing the integrated semiconductor laser element shown in FIG. 10 in an A-A cross section.

FIG. 11 is a view showing the integrated semiconductor laser element shown in FIG. 10 and viewed in an A-A cross section. As shown in FIG. 11, the structure of semiconductor layers of the semiconductor laser elements 100-1 to 100-N is the same as that of the semiconductor laser element 100 according to the embodiment 1. However, as described above, parameters of each of the semiconductor laser elements 100-1 to 100-N are set in accordance with their oscillation wavelengths, for example, the semiconductor laser elements 100-1 to 100-N have wavelengths of gain peaks in the vicinity of a center of 1530 nm to 1570 nm, that is in the vicinity of 1550 nm. The wavelength of the gain peak by the parameter setting for the semiconductor laser is at 20° C. to 60° C. as an operating temperature for the integrated semiconductor laser element 100.

The optical coupler 300 is a multi-mode-interferometer (MMI) type optical coupler having N pieces of input ports and an output port. As shown in FIG. 11, the optical coupler 300 has a buried mesa structure similar to those of the semiconductor laser elements 100-1 to 100-N. An n-side electrode 301, an n-type semiconductor layer 302, a waveguide core layer 303, and a p-type semiconductor layer 304 may be of the configurations that are the same as those of the n-side electrode 101, the n-type semiconductor layer 102, the waveguide core layer 103, and the p-type semiconductor layer 104 of the semiconductor laser element 100 respectively. That is, the n-type semiconductor layer 302 may be made of n-type InP, the waveguide core layer 303 may be made of GaInAsP, and the p-type semiconductor layer 304 may be made of p-type InP. However, the waveguide core layer 303 is a layer of, not MQW, but a single composition, and functions as a core layer through which a light is guided. The thickness of the waveguide core layer 303 is approximately the same as that of the MQW layer 103b. A mesa width of the optical coupler 300 is formed to be broader than those of the semiconductor laser elements 100-1 to 100-N. Since a current is not injected to the optical coupler 300, a p-side electrode is not formed on an upper portion of the semiconductor layers of the optical coupler 300.

The optical coupler 300 is not limited to an MMI-type optical coupler and may be other N×1 optical coupler such as, for example, a Fresnel coupler.

The optical waveguides 200-1 to 200-N are formed between the semiconductor laser elements 100-1 to 100-N and the optical coupler 300, have buried mesa structures similar to that of the optical coupler 300, and couple the semiconductor laser elements 100-1 to 100-N with N pieces of input ports of the optical coupler 300 optically. As shown in FIG. 11, configurations of an n-side electrode 201, an n-type semiconductor layer 202, a waveguide core layer 203, and a p-type semiconductor layer 204 may be the same as those of the n-side electrode 301, the n-type semiconductor layer 302, the waveguide core layer 303, and the p-type semiconductor layer 304 of the optical coupler 300 respectively.

The SOA 400 is connected to an output port 300a of the optical coupler 300. The SOA 400 has a buried mesa structure similar to those of the semiconductor laser elements 100-1 to 100-N. However, unlike the semiconductor laser elements 100-1 to 100-N, the SOA 400 does not have the diffraction grating layer 105. Configurations of an n-side electrode 401, an n-type semiconductor layer 402, a waveguide core layer 403, a p-type semiconductor layer 404, and a p-side electrode 405 may be the same as those of the n-side electrode 101, the n-type semiconductor layer 102, the waveguide core layer 103, the p-type semiconductor layer 104, and the p-side electrode 107 of the semiconductor laser element 100 respectively. The configuration of the waveguide core layer 403 may be the same as that of the MQW layer 103*b* and may be of a multi-quantum well structure on both sides of which, SCH layers similar to the SCH layers 103*a*, 103*c* may be provided. Similarly to the p-type semiconductor layer 106, the p-type semiconductor layer 404 may be provided with, at its upper portion, a contact layer made of p-type GaInAsP. Also in the SOA 400, although the width of the waveguide core layer 403 is for example, 1.4 µm to 1.7 µm, but not limited specifically if it is a width capable of guiding laser lights outputted by the semiconductor laser elements 100-1 to 100-N in a single mode.

Hereafter an operation of the integrated semiconductor laser element 100 will be explained. At first, a selected one of the semiconductor laser elements among the semiconductor laser elements 100-1 to 100-N is driven to output a desirable wavelength of single mode laser light. The trench grooves 108-1 to 108-M separate among the semiconductor laser elements 100-1 to 100-N electrically to increase separation resistances among the semiconductor laser elements, and are capable of selecting, and driving, one of the semiconductor laser elements 100-1 to 100-N easily.

Next, the laser light from a driven semiconductor laser element is guided in a single mode through one, coupled with the driven semiconductor laser element, of a plurality of the optical waveguides 200-1 to 200-N. The optical coupler 300 makes the laser light guided through the optical waveguide be passed therethrough and outputs the passed laser light from the output port 300*a*. The SOA 400 amplifies the laser light outputted from the output port 300*a* and outputs the amplified laser light from an output end 400*a* to outside the integrated semiconductor laser element 1000. The SOA 400 is used to compensate for optical loss, of the optical coupler 300 for the laser light from the driven semiconductor laser element and obtain a desirable power of optical output from the output end 400*a*. In a case where the optical coupler 300 has N pieces of input ports and an output port, the power of the laser light from the driven semiconductor laser element is attenuated to approximately 1/N by the optical coupler 300.

Herein the integrated semiconductor laser element 1000 according to the present embodiment 2 uses the semiconductor laser element 100 of the embodiment 1 as a semiconductor laser element. Therefore, the semiconductor laser element 100 undergoes a fewer optical absorption by the waveguide core layer 103 of the distributed Bragg reflection portion 120, and thus are high in optical output. Therefore, it is possible to decrease a value of a driving current for the semiconductor laser element 100. Hereby a power consumed by the integrated semiconductor laser element 1000 can be reduced.

In addition, since the waveguide core layer 103 of the distributed Bragg reflection portion 120 is etched periodically and entirely, even in a case where etching depths are varied, a coupling coefficient does not change, and thus, it is possible to reduce variance of characteristics among production lots. As a result, it is possible to restrain production yield from decreasing.

Since no processing is conducted to the waveguide core layer 103 in the distributed feedback laser portion 110 to which a power is injected, reliability and production yield are restrained from being reduced. In addition, since a spatial hole-burning is restrained or prevented from occurring in the semiconductor laser element 100 and the spectral linewidth is narrowed, it is preferable as a signal light source for a communication scheme making use of, for example, a high bit rate multilevel modulation method.

Moreover, since in the integrated semiconductor laser element 1000, the semiconductor laser element 100 is capable of being high in power output, the SOA 400 can be set at a small gain. Hereby it is possible to decrease a signal to spontaneous emission ratio (SSER) which is a quantity indicating a degree of noise caused by spontaneous emission by the SOA 400.

The distributed feedback laser has a problem that, since it outputs laser lights from both ends, an output light from a rear side opposite to an output side becomes a stray light. Therefore, the distributed feedback laser must be provided with a countermeasure against the stray light. However, since the semiconductor laser element 100 of the integrated semiconductor laser element 1000 is provided with the distributed Bragg reflection portion 120, an output light is hardly produced from the rear side and a stray light is hardly produced, no countermeasure against stray light is necessary or a simple countermeasure against stray light may be sufficient.

The present invention is not limited to the above-described embodiment. The present invention includes a configuration of combining the above-described elements appropriately. Further effects or modification examples can be derived by an ordinary skilled person in the art easily. Therefore, further wide aspects of the present invention are not limited to the above-described embodiment, and accordingly, various modifications may be made.

INDUSTRIAL APPLICABILITY

As described above, the semiconductor laser element, the integrated semiconductor laser element, and the method for producing the semiconductor laser element according to the present invention are suitable for use in a field of optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A semiconductor laser element comprising:
a semiconductor-layered structure including a waveguide core layer and having a distributed feedback laser portion and a distributed Bragg reflection portion, the waveguide core layer having a length continuous in an optical cavity length direction and a diffraction grating layer being disposed in vicinity of the waveguide core layer and along the waveguide core layer in the distributed feedback laser portion, and the waveguide core layer being disposed discretely and periodically to form a diffraction grating in the distributed Bragg reflection portion; and
an electrode for injecting a current to the distributed feedback laser portion, wherein
the distributed feedback laser portion oscillates a laser light at a wavelength corresponding to a period of the diffraction grating layer, and the diffraction grating formed by the waveguide core layer in the distributed Bragg reflection portion is set to have a stop band including the wavelength of the laser light.
2. The semiconductor laser element according to claim 1, wherein the stop band width of the diffraction grating which is formed by the waveguide core layer in the distributed

Bragg reflection portion is set to include the wavelength of the laser light within a range of a driving current for the semiconductor laser element.

3. The semiconductor laser element according to claim 2, wherein the range of the driving current is selected from a range of 0 A to 1 A, and the stop band width of the diffraction grating which is formed by the waveguide core layer in the distributed Bragg reflection portion is equal to or larger than 1.4 nm.

4. The semiconductor laser element according to claim 2, wherein the range of the driving current is selected from a range of 0 mA to 500 mA, and the stop band width of the diffraction grating which is formed by the waveguide core layer in the distributed Bragg reflection portion is equal to or larger than 0.7 nm.

5. The semiconductor laser element according to claim 1, wherein $\kappa_1 \times L_1$ is equal to or greater than 1 and $L_1$ is equal to or greater than 820 μm where $L_1$ is a length of the waveguide core layer in the distributed feedback laser portion and $\kappa_1$ is a coupling coefficient of the diffraction grating layer.

6. The semiconductor laser element according to claim 1, wherein $\kappa_2 \times L_2$ is greater than 2.18 and $\kappa_2$ is equal to or greater than 29 $cm^{-1}$ where $L_2$ is a length of the waveguide core layer in the distributed Bragg reflection portion and $\kappa_2$ is a coupling coefficient of the diffraction grating formed by the waveguide core layer.

7. The semiconductor laser element according to claim 1, wherein the diffraction grating layer in the distributed feedback laser portion has a phase-shifting portion.

8. An integrated semiconductor element comprising:
one or more of the semiconductor laser elements according to claim 1;
an optical coupler having input ports, number of which is same as number of the one or more semiconductor laser elements and into which output lights from the one or more of the semiconductor laser elements are input respectively and being capable of coupling and outputting the output light; and
a semiconductor optical amplifier amplifying the output light from the optical coupler, wherein
the one or more of the semiconductor laser elements, the optical coupler and the semiconductor optical amplifier are integrated in the integrated semiconductor element.

* * * * *